(12) United States Patent
Arvin et al.

(10) Patent No.: US 7,683,493 B2
(45) Date of Patent: Mar. 23, 2010

(54) INTERMETALLIC DIFFUSION BLOCK DEVICE AND METHOD OF MANUFACTURE

(75) Inventors: Charles L. Arvin, Poughkeepsie, NY (US); Carla A. Bailey, Poughkeepsie, NY (US); Harry D. Cox, Rifton, NY (US); Hua Gan, Plainsboro, NJ (US); Hsichang Liu, Fishkill, NY (US); Arthur G. Merryman, Hopewell Junction, NY (US); Vall F. McClean, Poughkeepsie, NY (US); Srinivasa S. N. Reddy, Lagrangeville, NY (US); Brian R. Sundlof, Verbank, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/111,510

(22) Filed: Apr. 29, 2008

(65) Prior Publication Data

US 2009/0267228 A1  Oct. 29, 2009

(51) Int. Cl.
*H01L 23/52* (2006.01)

(52) U.S. Cl. .............................. 257/779; 257/E21.521

(58) Field of Classification Search .................. 257/737, 257/778–780, 734, E21.521
See application file for complete search history.

(56) References Cited

U.S. PATENT DOCUMENTS

| 6,465,886 | B1 * | 10/2002 | Horiuchi et al. | 257/738 |
|---|---|---|---|---|
| 6,806,578 | B2 * | 10/2004 | Howell et al. | 257/762 |
| 6,924,558 | B2 * | 8/2005 | Hanaoka | 257/786 |
| 7,327,031 | B2 * | 2/2008 | Takewaki et al. | 257/737 |
| 7,405,479 | B2 * | 7/2008 | Kanagawa et al. | 257/738 |

* cited by examiner

*Primary Examiner*—Nathan W Ha
(74) *Attorney, Agent, or Firm*—Cantor Colburn LLP; Joseph Petrokaitis

(57) ABSTRACT

One embodiment of the present invention is directed to an under bump metallurgy material. The under bump metallurgy material of this embodiment includes an adhesion layer and a conduction layer formed on top of the adhesion layer. The under bump metallurgy material of this embodiment also includes a barrier layer plated on top of the conduction layer and a sacrificial layer plated on top of the barrier layer. The conduction layer of this embodiment includes a trench formed therein, the trench contacting a portion of the barrier layer and blocking a path of intermetallic formation between the conduction layer and the sacrificial layer.

7 Claims, 4 Drawing Sheets

INTERMETALLIC DIFFUSION BLOCK DEVICE AND METHOD OF MANUFACTURE

BACKGROUND OF THE INVENTION

1. Field of the Invention

This invention relates generally to semiconductors, and more particularly to under bump structures having reduced inter-metallic formation.

2. Description of Background

A Controlled Collapse Chip Connection, or C4, is one type of mounting that may be used for mounting semiconductor devices, such as integrated circuits (IC's), Microelectromechanical Systems (MEMS) or other components, to a wafer. C4 utilizes solder bumps instead of wire bonds for the connection. The solder bumps are deposited on chip pads which are located on a top side of a wafer during a final wafer processing step. These solder bumps may be used to connect any type of circuit or device to the wafer.

Environmental legislation in Europe has specifically targeted the wide use of lead in the electronics industry. The directives in Europe require many new electronic circuit boards to be lead free by 1 Jul. 2006, mostly in the consumer goods industry, but in some others as well. With lead-free proliferation driving development activities to focus on lead-free solders, other types of solder are now being utilized.

Many new technical challenges have arisen due to utilizing lead-free solder such as tin. For instance, traditional leaded solders have a significantly higher melting point than lead-free solders, which renders them unsuitable for use with heat-sensitive electronic components and their plastic packaging. To overcome this problem, solder alloys with a high silver content and no lead have been developed with a melting point slightly lower than traditional solders.

Lead-free construction has also extended to components, pins, and connectors. Most of these pins used copper frames, and either lead, tin, gold or other finishes. Tin finishes are the most popular of lead-free finishes.

Having to use lead-free solders has given rise to a problem related to the formation of intermetallics. The formation of intermetallics leads to reliability concerns. The amount of intermetallic increase with time and temperature can result in the degradation of the under bump metallurgy (UBM) interface. Many UBM structures now incorporate nickel (Ni) layers to prevent or reduce intermetallic formation by decreasing the diffusion of copper into the solder bumps. For plated UBM structures, the common practice is to sputter a copper (Cu) seed layer prior to plating. During reflow, solder ball wets expose the edge of the sputtered Cu layer. The intermetallic formation is then dictated by the diffusion path and can result in an effective decrease in UBM pad adhesion. That is, if the sputtered copper layer is not effectively separated from an upper sacrificial layer of the pad (typically formed of Cu), intermetallics may be formed and reduce the strength of the bond to the solder ball placed thereon.

SUMMARY OF THE INVENTION

One embodiment of the present invention is directed to an under bump metallurgy material. The under bump metallurgy material of this embodiment includes an adhesion layer and a conduction layer formed on top of the adhesion layer. The under bump metallurgy material of this embodiment also includes a barrier layer plated on top of the conduction layer and a sacrificial layer plated on top of the barrier layer. The conduction layer of this embodiment includes a trench formed therein, the trench contacting a portion of the barrier layer and blocking a path of intermetallic formation between the conduction layer and the sacrificial layer.

Another embodiment of the present invention is directed to a method of manufacturing a lead-free solder bump connection. The method of this embodiment includes sputtering an adhesion layer; sputtering a conduction layer on top of the adhesion layer; coating the conduction layer with a layer of photo-resist; developing the photo-resist to leave a predetermined pattern of photo-resist on a top surface of the conduction layer; forming a barrier layer on top of the conduction layer; forming a sacrificial layer on top of the barrier layer; washing the lead-free solder bump connection with a solvent to remove at least a portion of the remaining photo-resist; and etching the lead-free solder bump connection to form a trench in the conduction layer in a location that underlies an edge of the barrier layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Aspects of the present invention are directed to a UBM for lead-free applications having reduced intermetallic formations and methods for manufacturing the same. In one embodiment, the present invention includes a conduction layer (typically made of copper) that has trench created therein that prevents or reduces the formation of intermetallics.

Figure 1:
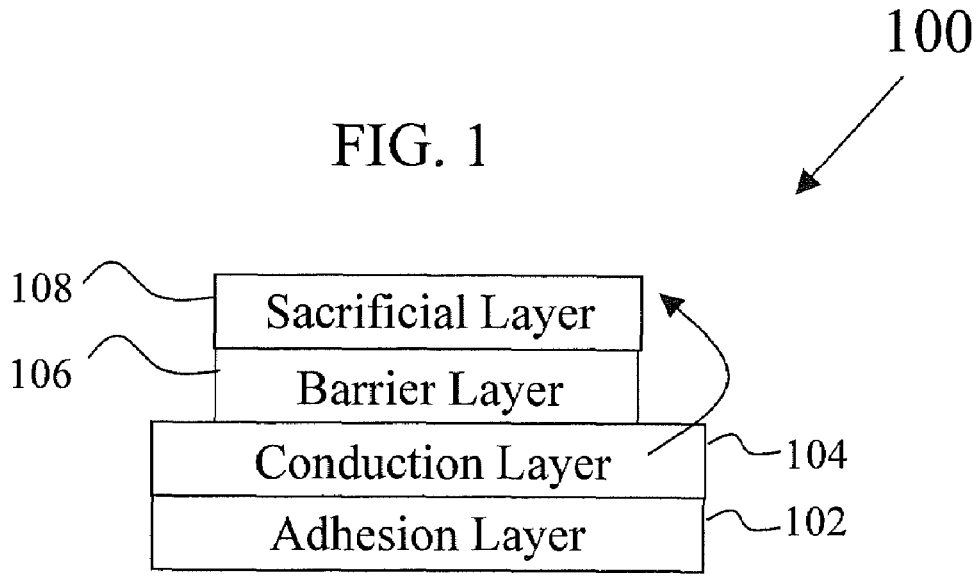
FIG. 1 shows a lead-free under bump metallurgy.

FIG. 1 shows a cutaway side view of a typical UBM structure 100. The UBM structure 100 includes an adhesion layer 102. This adhesion layer 102 is made of titanium tungsten, for example. Of course, other metals may be used for this layer. As one of ordinary skill in the art will readily realize this adhesion layer 102 may be used to adhere to an underlayer (not shown) of polyimide. The adhesion layer 102 is deposited using a sputtering technique. Of course, the adhesion layer could be created in any manner including, for example, electroplating.

On top of the adhesion layer 102 is a conduction layer 104, which may be used to distribute electrical energy or signals over the surface of a wafer. The conduction layer 104 may, as one of ordinary skill in the art will readily realize, be made of copper. Similar to the adhesion layer 102, the conduction layer 104 is deposited using a sputtering technique. Alternatively, the conduction layer 104 may be formed by alternative techniques such as, for example, electroplating.

A barrier layer 106 is then electroplated on top of the conduction layer 104. The barrier layer 106 may include, in some instances, a nickel material. The barrier layer 106 may be formed in other manners. For example, the barrier layer 106 may be formed using sputtering techniques.

Above the barrier layer 106, a sacrificial layer 108 is formed. The sacrificial layer 108 is configured to receive a lead-free solder ball. The sacrificial layer 108 includes copper and is formed by electroplating techniques. However, the sacrificial layer 108 may ultimately diffuse into a lead-free solder ball (typically composed of tin or a tin alloy) placed thereon.

As shown in FIG. 1, portions of the conduction layer 104 may defuse along the path represented by arrow A into the sacrificial layer 108. This may cause intermetallics to form in and around the edges of the sacrificial layer 108. The formation of intermetallics may, in some cases, cause the sacrificial layer to become more brittle or otherwise unreliable in that the surface of area of the sacrificial layer may be reduced. This may lead, in some instances, to a weaker bond between the solder ball and the BLM 100 resulting in a failure.

Figure 2:
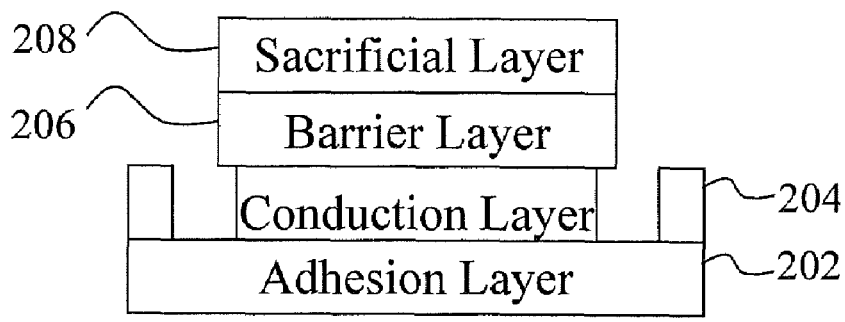
FIG. 2 shows an embodiment of a lead-free under bump metallurgy according to one embodiment of the present invention.

FIG. 2 shows a BLM structure 200 according to one embodiment of the present invention. The BLM structure 200 includes an intermetallic blocking trench formed in one of its layers such that the trench blocks or reduces the diffusion of a conduction layer into the solder ball which might otherwise lead to a less reliable bond between the solder ball and the BLM structure 200.

The BLM structure 200 may include an adhesion layer 202. This adhesion layer 202 may, in some embodiments, be made of titanium tungsten. Of course, other metals may be used for this layer. As one of ordinary skill in the art will readily realize, the adhesion layer 202 may be used to adhere or otherwise connect to an under-layer (not shown) of polyimide. In some embodiments the adhesion layer 202 is deposited using a sputtering technique. Of course, the adhesion layer could be created in any manner including, for example, electroplating.

The BLM structure 200 may also include a conduction layer 204. This conduction layer 204 may be used to distribute electrical energy or signals over the surface of a wafer. The conduction layer 204 may, as one of ordinary skill in the art will readily realize, be made of copper. In some embodiments, the conduction layer 204 is deposited using a sputtering technique. Of course, the conduction layer 204 could be created in any manner including, for example, electroplating.

The conduction layer 204 may include a trench 210 located therein. The trench 210 may serve to keep the conduction layer 204 from forming intermetallics with the substances in the sacrificial layer 208 or the solder balls which are ultimately place on the sacrificial layer 208. In some embodiments, the trench 210 is circular, when viewed from above, in shape. Of course, the trench 210 could be of any shape.

The BLM structure 200 may also include a barrier layer 206. The barrier layer 206 may be plated on top of the conduction layer 204 or otherwise be formed thereon. In some embodiments this layer may be nickel. An edge of the conduction layer may, in some embodiments, extend over a portion of the width of the trench 210. Being so arranged, the conduction layer 204 may effectively be blocked from diffusing into the sacrificial layer 208 (or the solder ball ultimately placed thereon).

The BLM structure 200 may also include a sacrificial layer 208 above the barrier layer 206. The sacrificial layer 208 is configured to receive a lead-free solder ball. In some embodiments, the sacrificial layer 208 is composed of copper and is formed by electroplating techniques. As one of ordinary skill in the art will readily realize, the sacrificial layer 108 may ultimately diffuse into a lead-free solder ball (typically composed of tin or a tin alloy) placed thereon.

Figure 3:
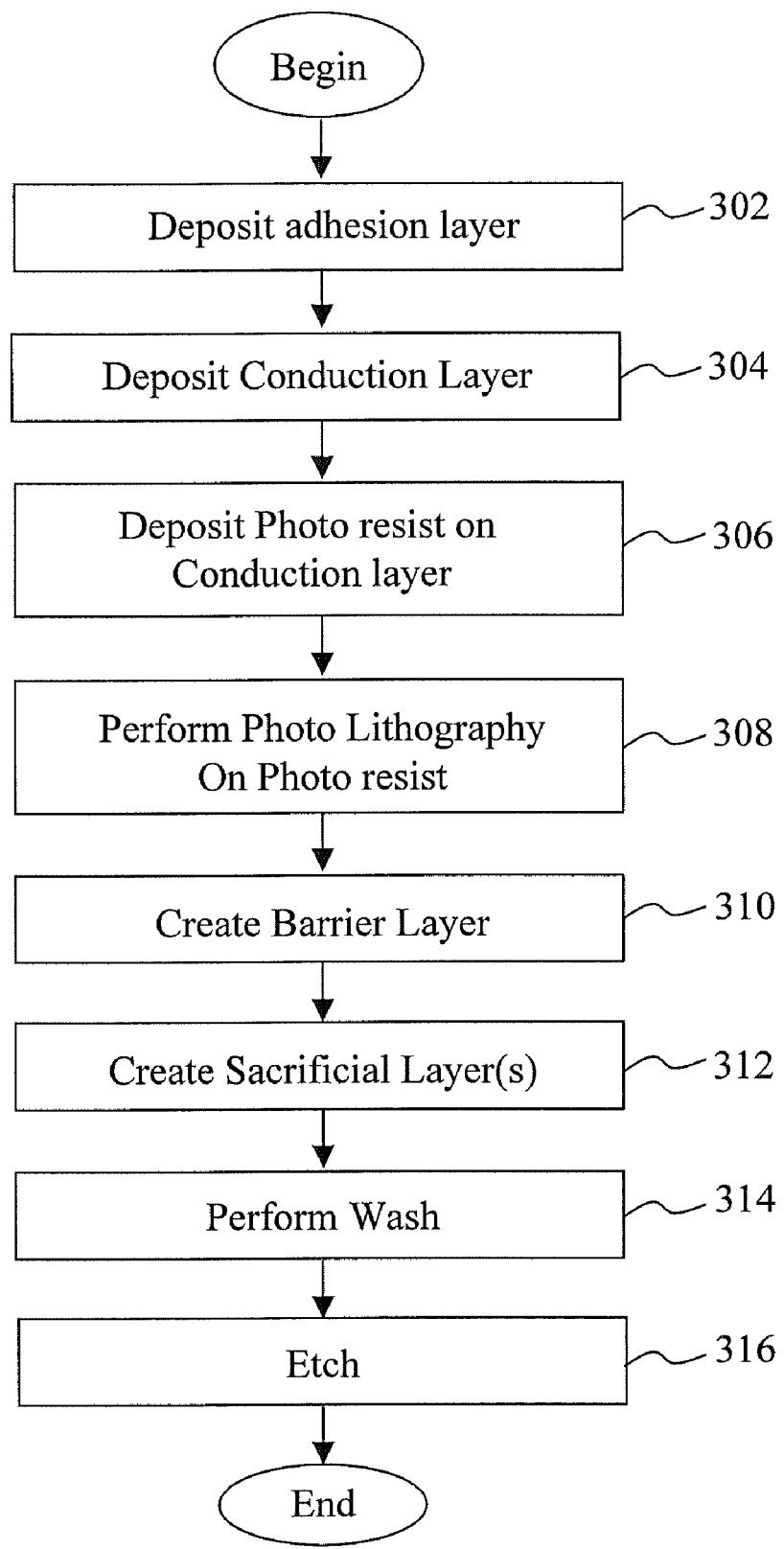
FIG. 3 shows a method by which a lead-free under bump metallurgy according to one embodiment of the present invention may be created.

FIG. 3 shows a method by which a UBM according to the present invention may be created. The process begins at block 302 where an adhesion layer is deposited. This adhesion layer may be deposited by well known sputtering techniques or any other technique. In some embodiments this adhesion layer is made of titanium tungsten.

In block 304 a conduction layer is deposited on top of the adhesion layer. The conduction layer may be made of, for example, copper. As with the adhesion layer, the conduction layer may be deposited by well known sputtering techniques or any other technique.

At block 306, photo-resist is deposited on top of the conduction layer. The deposition of photo-resist is well known in the art. At block 308, photolithography is performed on the photo-resist to create via in the photo-resist on top of the conduction layer.

Figure 4A:
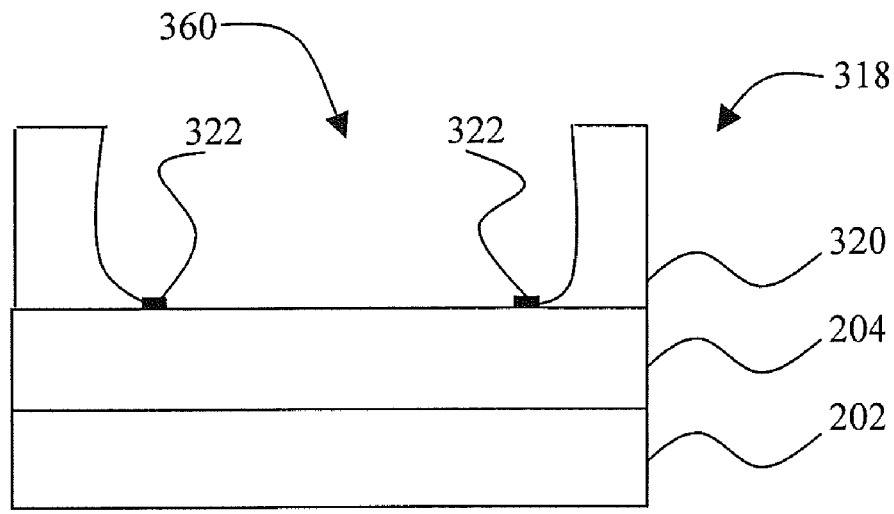
FIGS. 4A-4D show side views of various stages of the creation of an under bump metallurgy according to one embodiment of the present invention.

FIG. 4A shows a cut-away side view of a BLM structure 318 as it may exist after step 308 has been performed. The BLM structure 318 includes an adhesion layer 202 and a conduction layer 204. A layer of photo-resist 320 has been formed on top of the conduction layer 204 and, as stated above, photolithography has been performed on the layer of photo-resist 320 to form a via 360 to receive later formed layers.

In some embodiments, the photolithography process may be controlled so that portions of the photo-resist that was to be removed may remain. As shown in FIG. 3B, and in practice, residual photo-resist particles 322 may exist near the walls of the receiving depression 324. In some embodiments, these residual photo-resist particles 322 may be beneficial. In particular, when they are removed they may create a bridge through a barrier layer formed on top of the conduction layer 204 to allow an etch chemical to access the conduction layer to create a trench therein.

Referring again to FIG. 3, at block 310 a barrier layer is created on top of the conduction layer and the photo-resist still remaining from the photolithography process. This barrier layer may be created in many manners. For example the barrier layer may be created by electroplating. In one embodiment this barrier layer is composed of nickel.

In block 312 a sacrificial layer is placed on top of the barrier layer 312. The creation of a sacrificial layer may be done by electroplating and may include plating copper onto the top of the barrier layer.

Figure 4B:
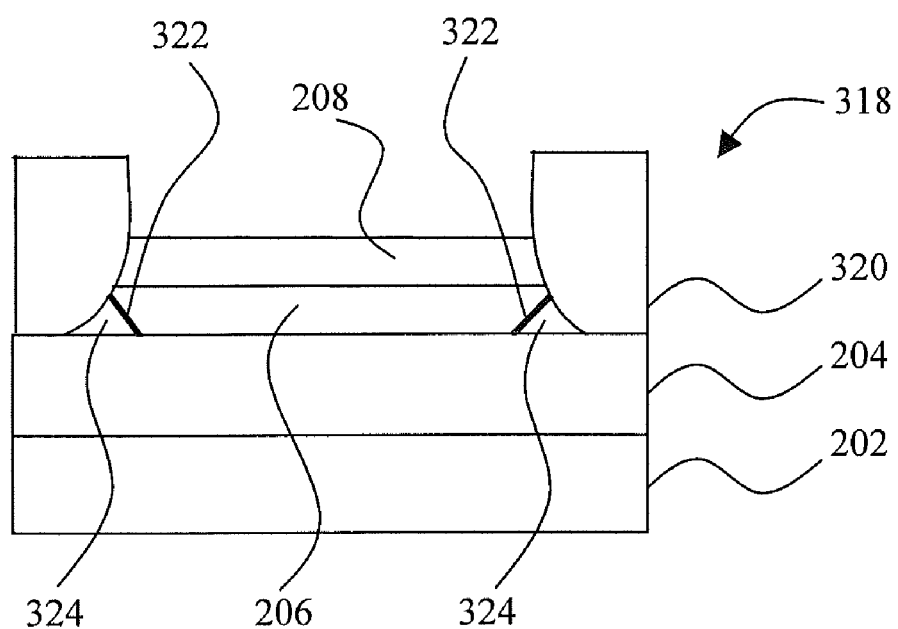

FIG. 4B shows a cut-away side view of a BLM structure 318 after a barrier layer 206 has been formed on the conduction layer 204 and a sacrificial layer 208 has been formed on top of the conduction layer. As shown, the BLM structure 318 still includes photo-resist layer 320 and the residual photo-resist particles 322. As shown, the barrier layer 208 includes a wing portion 324. This wing portion 324 is a part of the barrier layer 206 that slipped under the photo-resist 320 during the formation of the barrier layer 206. Such an occurrence is well known in the art. However, the presence of the residual photo-resist particles 322 during the formation process cause the barrier layer 206 to be formed such that it includes photo-resist pockets which are formed by the photo-resist particles 322. These pockets extend through the barrier layer 106.

Referring again to FIG. 3, at block 314 a photo-resist wash is conducted. This photo-resist wash removes the remaining photo-resist on the outsides of the barrier and sacrificial layers. This photo-resist wash also removes all of the photo-resist from any photo-resist pockets formed in the barrier layer by the residual photo resists particles. The removal of the photo-resist in the photo-resists pockets creates a channel through the barrier layer.

Figure 4C:
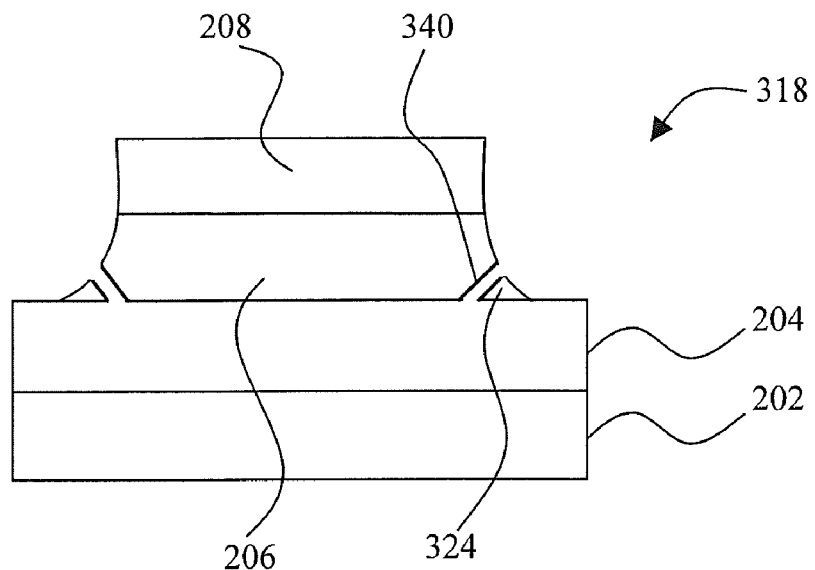

FIG. 4C shows a cut-away side view of a BLM structure 318 after the photo-resist layer and the residual photo-resist particles have been removed by, for example, a photo-resist wash or other techniques. The barrier layer 206 includes channels 340 that are a path through the barrier layer to the conduction layer 204. The channels 340 were created by the removal of the residual photo-resist particles during the photo-resist wash.

Referring again to FIG. 3, a chemical etching process may be performed at block 316. This process may be two fold. The first step of this process includes a first etching process that etches the material of the conduction layer. This process may include exposing the BLM 318 to a chemical that dissolves or otherwise etches copper. The second process may include exposing the BLM to a process that dissolves or otherwise etches the material the adhesion layer is formed of.

Figure 4D:
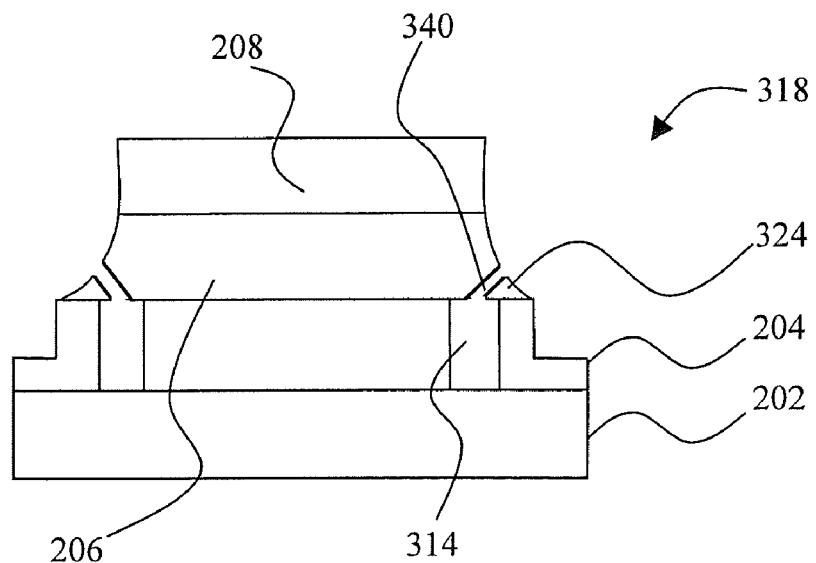

FIG. 4D shows a cut-away side view of a BLM structure 318 after an etching process that dissolves the conduction layer 204 has been performed. As shown, only a portion of the adhesion layer 204 has been dissolved. However, the process could be conducted in such a manner that all of the conduction layer 204 that is exposed to the etching process is dissolved. The etching chemicals used in the etching process pass through the channels 340 so that they may contact the conduction layer 204. The contact between the etching chemical that passes through the channels 340 and the conduction layer 204 results in the creation of the trench 314. As discussed above, the trench 314 may serve to reduce diffusion of the conduction layer 204 into the sacrificial layer 208 and thereby reduce the formation of intermetallics.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An under bump metallurgy material comprising:
   an adhesion layer;
   a conduction layer formed on top of the adhesion layer;
   a metallic barrier layer plated on top of the conduction layer; and
   a sacrificial layer plated on top of the barrier layer;
   wherein the conduction layer includes a trench formed therein, the trench contacting a portion of the barrier layer and blocking a path of intermetallic formation between the conduction layer and the sacrificial layer.

2. The under bump metallurgy material of claim 1, wherein the conduction layer is composed of copper.

3. The under bump metallurgy material of claim 2, wherein the adhesion layer is composed of titanium.

4. The under bump metallurgy material of claim of claim 2, wherein the barrier layer is composed of nickel.

5. The under bump metallurgy material of claim of claim 4, wherein the sacrificial layer is composed of copper.

6. The under bump metallurgy material of claim 2, wherein the trench is etched into the conduction layer.

7. The under bump metallurgy material of claim 6, wherein the trench is etched into the conduction layer using photolithography.

* * * * *